United States Patent [19]
Roos

[11] Patent Number: 5,982,618
[45] Date of Patent: Nov. 9, 1999

[54] ARRANGEMENT IN COOLING ELECTRONIC EQUIPMENT

[75] Inventor: Sture Gösta Roos, Bergshamra, Sweden

[73] Assignee: Telefonaktiebolaget LM Ericsson, Stockholm, Sweden

[21] Appl. No.: 09/043,414

[22] PCT Filed: Oct. 1, 1996

[86] PCT No.: PCT/SE96/01230

§ 371 Date: Mar. 19, 1998

§ 102(e) Date: Mar. 19, 1998

[87] PCT Pub. No.: WO97/13394

PCT Pub. Date: Apr. 10, 1997

[30] Foreign Application Priority Data

Oct. 2, 1995 [SE] Sweden .................................. 9503403

[51] Int. Cl.[6] .................................................. H05H 7/20
[52] U.S. Cl. ........................................................ 361/695
[58] Field of Search ................................. 361/688–697, 361/752, 796, 797

[56] References Cited

U.S. PATENT DOCUMENTS 3,268,772  8/1966  Kamei et al. .
4,620,263  10/1986  Ito .............................................. 361/690
5,040,095  8/1991  Beaty et al. .

FOREIGN PATENT DOCUMENTS 384 343     10/1987  Australia .
3228368 C2  3/1985   Germany .
4209477 C2  10/1994  Germany .
447 440     11/1986  Sweden .

*Primary Examiner*—Gregory Thompson
*Attorney, Agent, or Firm*—Burns, Doane, Swecker & Mathis, L.L.P.

[57] ABSTRACT

An arrangement is provided that may be used for cooling electronic equipment, where the electronic equipment is housed in a rack arrangement with an arrangement for transferring the heat energy produced by the equipment to one or more rack-related cooling units each of which is designed to transfer heat energy by means of convection to the ambient air about the rack and the equipment. At least one of the cooling units contains vertically-oriented cooling flanges, positioned next to one another, and a fan unit that is designed to be able to provide, on demand, the cooling unit and the cooling flanges with a stream of forced air, thereby increasing heat emission from the cooling flanges to the ambient air. The fan unit is located at the side of a rack unit, and positioned beside, or part way inside, the cooling unit. The fan unit is arranged to provide a stream of forced air to each space that is formed between the flanges of the cooling unit; the flow of said stream of forced air is restricted to within the area for the sections of the cooling unit flanges that faces towards the rack unit. The stream of air produced for several collateral spaces is aimed to flow in an upward direction.

22 Claims, 2 Drawing Sheets

ARRANGEMENT IN COOLING ELECTRONIC EQUIPMENT

TECHNICAL FIELD

The present invention relates to an arrangement that may be used to cool electronic equipment, or a set of electronic assemblies, where said electronic equipment is housed in a rack or a rack arrangement.

The rack arrangement is equipped with a means for transferring heat energy produced by said equipment to one or more rack-related cooling units.

The cooling units are designed to be able to transfer heat energy by means of convection to the ambient air about the rack and equipment.

At least one of said cooling units contains vertically-oriented cooling flanges, positioned next to one another.

The present invention is even based on the ability to use a fan unit, when necessary, that is designed to be able to provide the cooling unit and the cooling flanges with a stream of forced air, thereby increasing heat dissipation from the cooling flanges to the ambient air.

BACKGROUND ART

Several different embodiments exist for arrangements that may be used for cooling electronic equipment that is housed in a rack arrangement with means for transferring heat energy that is produced in said equipment to one or more rack-related cooling units.

Cooling units with associated cooling flanges have even been arranged to provide requisite cooling, by designing and adapting the cooling unit to transfer sufficient heat energy by means of convection to the ambient air about the rack and the equipment.

It has also been shown that the heat-emitting capacity may be increased, continuously or temporarily, by using a fan unit that is designed to be able to supply the cooling unit and the cooling flanges with a stream of forced air as needed.

As examples of background art we refer to the following publications:
DE-C2-32 28 368

This publication describes an arrangement for cooling electronic equipment while using a fan unit in order to generate a forced cooling stream of air.

More specifically an arrangement is described where two incoming streams of air are permitted to pass through an upper (31) and a lower (32) opening with opposing air streams enclosed in a duct in order to pass along cooling flanges of a mutual cooling unit (33). The fan unit is positioned in the centre area of the cooling flanges.
AT-B-384 343

This publication describes that cooling flanges (5) can be encompassed by a separate wall section (13) in order to form an enclosed cooling duct. A fan unit (16) is connectable to the lower part of the cooling duct and a forced stream of air is allowed to pass along the complete cooling duct.
SE-B-85 013393-6

This publication describes an arrangement for cooling electronic equipment while using a fan unit in order to generate a forced cooling stream of air.

More specifically this publication describes an enclosure of electrical material, where the heat, generated within the enclosure (1), is conducted to the surroundings through heat exchanging between an inner and an outer air stream. At least part of the casing of the enclosure is provided with surface enlargements in order to increase the heat emission.

The casing is therefore preferably given a wave-form (5) with a surface that, besides this, is provided with grooves. It is only required to supplement such enclosure with a simple cover (9) and a fan system to obtain an effective heat exchanger with a forced air stream.
U.S. Pat. No. 3,268,772

This publication describes an arrangement for cooling electronic equipment while using a fan unit in order to generate a forced cooling stream of air.

It is described that air is allowed to pass through a nozzle (87) into a cooling system (90) with a number of vents (88) in order to conduct the heat from the system. The package, including the system, is positioned on one side of the casing of the equipment.
U.S. Pat. No. 5,040,095

This publication describes an arrangement for cooling electronic equipment while using a fan unit in order to generate a forced cooling stream of air.

It is specifically shown that heat is dissipated to the ambient air through corrugated roof (35) and side panels.
DE-C2-4,209,477

This publication describes an arrangement for cooling electronic equipment while using a fan unit in order to generate a forced cooling stream of air.

The fan arrangement (21) is activated to generate an air stream along the cooling flanges (18).

As an additional example of the background art, we refer to what is shown and described in the publications EP-A1-0 564 315; EP-A2-0 449 150; U.S. Pat. No. 4,758,924; U.S. Pat. No. 5,237,486; and DE-C2-3 717 009.

A more detailed description of an application of the present invention shows that when the electronic equipment consists of a main distribution arrangement for a telephone exchange, with a so called subscriber board, the momentary heat building in the electronic equipment is directly related to, and dependent on, the momentary load, which means that heat emissions at peak hours are much greater than during normal periods of telephone traffic intensity.

It is also known that the greatest intensity at peak hour telephone traffic does not necessarily last a full hour. The actual duration may be shorter.

It is also been shown that applying a stream of forced air is an unsuitable method for cooling electronic equipment, since streams of forced air also circulate dust. Instead, cooling by means of convection is preferred.

Given the significant characteristics of the present invention, one may add that it is known that a metal's ability to absorb heat increases with volume.

It is also known that a stream of forced air that is aimed along a surface tends to follow the contours of that surface.

SUMMARY OF THE INVENTION

Technical Problems

Given the background art as it has been described above, it ought to be considered a technical problem to be able to create, by simple means, conditions whereby a set of electronic equipment, which is housed in a rack arrangement and whose production of heat varies significantly with time, can easily be cooled: in the first place via convection, and in the second place via a fan unit for which measures have been taken not only to reduce dust circulation, but also to reduce the amount of noise that it produces.

It should also be considered a technical problem to be able to create a way of cooling electronic equipment that takes into consideration the variation of telephone traffic over time, by distributing a number of telephone lines on a printed board assembly, and by adapting the volume and shape of cooling units in accordance with a given heat-storage capacity.

Another technical problem is in being able to create conditions of this kind by dimensioning a cooling unit so that the amount of heat it emits is satisfactory even during peak traffic, as well as when the temperature of the ambient air in the surrounding room is unusually high.

Another technical problem is in being able to realize the significance of showing the use of a fan unit, where the lifetime of the fan can be extended considerably, and where the need for air filters can be eliminated.

Another technical problem is in being able to integrate one or more fan units into a rack arrangement with cooling units, so that it/they can be placed between the rack arrangement and the cooling unit at a specific height level from the end sections of the rack arrangement and the cooling unit.

Given the background art, it must also be considered a technical problem to be able to realize the significance of placing said fan unit at the side of a rack unit, orienting it next to, or partially inside of, a cooling unit.

Another technical problem is in being able to realize the significance of, and the advantages that are associated with, arranging the fan unit to provide a more-or-less continuous stream of forced air to each space that is formed between the cooling flanges, as well as to realize that said stream of forced air must be restricted to within the area that comprises those parts of the cooling unit flanges that faces towards the rack arrangement.

Another technical problem is in being able to realize how to provide possibilities to let a flow of forced air control convected air to a certain extent in an arrangement for cooling electronic equipment comprising cooling flanges.

It must then be regarded as a technical problem to be able to realize the simplifications that are created by allowing the same fan unit to produce multiple parallel streams of forced air for several spaces, as well as by allowing these streams of air to follow the surface contours and thereafter create a combined exhaust of an external convection air flow.

Another technical problem lies in being able to set the distance between adjacent flanges and the width of flanges for one or more chosen spaces, as well as in adapting these distances so that said streams of forced air are primarily restricted to within the innermost sections of said spaces, and that these streams follow upwards along parallel, for example "U"-related, sections or surfaces.

Another technical problem is in being able to realize the importance of allowing the cooling unit to contain several parallel flanges, oriented away from the rack arrangement and extending away from a rack-related base plate that is designed in part to function as a holder for a fan unit.

Another technical problem is in forming the holder for the fan unit in part in the base plate, and in part in the rack unit, giving the holder a cross-section shape of a circular recess that is designed to hold a cylindrical fan unit.

Another technical problem is in being able to realize the advantages of, as well as the prerequisites and dimensions for, the recess in the base plate, in order to enable the recess to pass through the base plate and part way into the flanges, and thereby create exit holes for each of the streams of forced air between the flanges and the adjacent base plate.

Another technical problem is in being able to realize the significance of permitting the heat-storage capacity of the cooling unit and its materials to be adapted to store heat energy during "peak hours" without allowing the temperature of the cooling unit to exceed a predetermined value.

Another technical problem is in being able to realize the significance of, and the advantages associated with, allowing the fan unit to be designed to be able to produce a continuous stream of forced air that, in terms of heat transmission, is insignificant, and when the temperature reaches an upper parameter, a means of temperature monitoring may be activated in order to permit the fan unit to produce an increasingly powerful stream of forced air that, in terms of heat transmission, is very significant.

Another technical problem is in being able to realize that the relatively insignificant stream of forced air is created by allowing the fan unit to run at a very low speed (rpm).

Another technical problem is in being able to realize the significance of being able to use only one fan unit for a single rack arrangement that houses electronic equipment, as well as in allowing the fan unit to be coordinated to the rack and the base plate, and placed at an adapted and selected height level relative to the rack.

Another technical problem is in being able to realize the significance of using several fan units that are attached at different height levels, and temperature-monitoring equipment that may activate one or more of these fan units, depending on an existing distribution of, or variation in, temperature.

Another technical problem is in being able to realize the significance of setting the distance between adjacent flanges at 10–25 mm, in order to form one or more spaces within the cooling unit, as well as setting the width of the flanges at 30–100 mm.

Another technical problem lies in being able to show an arrangement that is specially designed for cooling electronic equipment that is contained in the type of main distribution arrangement for a telephone exchange that is shown and described in the Swedish patent application 95 01455-1, dated Apr. 20, 1995.

Solutions

In order to solve one or more of the above technical problems, the present invention proceeds from an arrangement that may be used for cooling one or more pieces of electronic equipment, where said electronic equipment is housed in a rack arrangement with means for transferring the heat energy produced by said equipment to one or more rack-related cooling units, each of which is designed to transfer heat energy by means of convection to the ambient air about the rack and the equipment. At least one of said cooling units contains vertically-oriented cooling flanges, positioned next to one another, and a fan unit that is designed to be able to provide, on demand, the cooling unit and the cooling flanges with a stream of forced air, thereby increasing heat emissions from the cooling flanges to the ambient air.

Given an arrangement of this kind, the present invention shows that said fan unit is placed at the side of a rack unit, and oriented adjacent to, or partially inside of, a cooling unit. The fan unit is arranged to be able to provide a weak stream of forced air to each space that is formed between cooling unit flanges. Said stream of forced air is restricted to within the area for those parts of the cooling unit flanges that faces towards the rack unit. The produced streams of air are aimed to flow in an upward direction for numerous spaces.

The proposed embodiments of the present invention, which fall within the scope of inventive thought, show that the distance between adjacent flanges, and the width of the flanges for one or more given spaces are primarily designed to restrict the flow of forced air to within the inner sections of the spaces, flowing upwards along parallel, for example "U"-related, sections or surfaces.

The cooling unit must consist of several parallel flanges, oriented from the rack and extending from a rack-related base plate that is designed in part to function as a holder for a fan unit.

Further, the invention shows that the holder is formed in part in the base plate and in part in the rack, having a cross-section shape of a circular recess that may be used to hold a cylindrical fan unit.

Moreover, the invention shows that the recess in the base plate must be adapted to pass through the base plate and part way into the flanges, thereby forming an opening for the stream of forced air.

In addition, the present invention shows that a specific heat-storage capacity for the cooling unit and its materials can be adapted to store heat energy during peak hours without allowing the temperature of the cooling unit to exceed a predetermined value.

The invention shows further that the fan unit is designed to be able to produce a more-or-less continuous stream of forced air that, in terms of heat transmission, is insignificant; however, when the temperature in the cooling unit reaches an upper parameter, a means for monitoring temperatures may be activated to allow the fan unit to produce a powerful stream of forced air that, in terms of heat transmission, is very significant.

The present invention shows further, that it should be possible to attach a single tan unit to the rack adjacent to the base place, positioning the fan unit at a specific height level, in order to obtain the required cooling effect.

The invention even shows that several fan units may be arranged at various height levels. These can be activated by temperature-sensing or -monitoring equipment that drives said fan units according to the existing distribution of, or variance in, temperature.

Moreover, the present invention indicates that, in order to form a space within the cooling unit, the distance between adjacent flanges is set at between 10 and 25 mm, preferably between 15 and 20 mm. Similarly, the width of the flanges is set at between 30 and 120 mm, preferably between 60 and 100 mm.

Further, the present invention suggests that an arrangement that is especially adapted for cooling electronic equipment can be used to advantage in a main distribution arrangement for a telephone exchange; particularly in a design that relates to the Swedish patent application that was described in greater detail above.

Advantages

The primary advantage that characterizes an arrangement that may be used for cooling one or more pieces of electronic equipment in a rack arrangement is that conditions are created whereby, in the first place, conditions are created for transferring heat, via convection, to a stream of air, and where a fan unit may be used to produce a more-or-less continuous stream of forced air that, in terms of heat transmission, is relatively insignificant. Thus, when the temperature for the cooling unit exceeds a predetermined value, the fan unit can be activated to produce a powerful stream of forced air that, in terms of heat transmission, is very significant.

BRIEF DESCRIPTION OF THE DRAWINGS

A currently proposed embodiment of a main distribution arrangement for a telephone exchange which includes an arrangement that may be used for cooling electronic equipment, according to the present invention, will now be described in greater detail relative to the accompanying drawings, in which.

DESCRIPTION OF THE CURRENTLY PROPOSED EMBODIMENT

Figure 1:
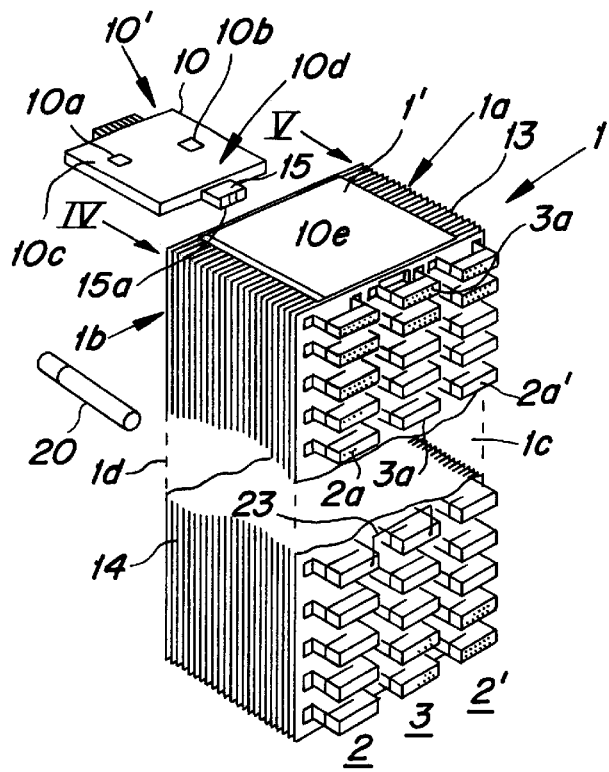
FIG. 1 shows in a first perspective view, a cabinet designed for several line circuit-related blocks, a centrally-oriented column of line circuit-related connection terminals for a telephone exchange, and two side columns of subscriber-related connection terminals for telephone exchanges.
Figure 2:
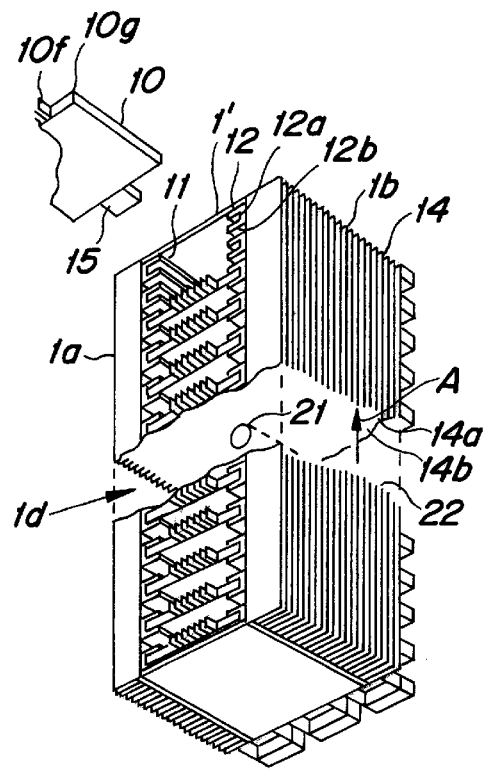
FIG. 2 shows the same cabinet from a second, opposite perspective view.

With reference to FIGS. 1 and 2, two different views of a cabinet that comprises a main distribution arrangement for a telephone exchange is shown.

The cabinet, which we designate Reference 1, includes a rack with two parallel, opposing rack sides 1a, 1b, as well as a main distribution-related rack side 1c.

From an additional rack side 1d, several blocks can be inserted and removed in a way that will be described in greater detail later in this document.

The invention is based on the concept that each block of this kind must be able to enclose a printed board assembly that may include several, for example eight, line circuit connections that have been designed for a telephone exchange.

FIG. 1 shows several subscriber-related connectors affixed to the rack. The connectors, which are coordinated to one or more connection terminals, are structured in rows and positioned above one another in a column 2. FIG. 1 also shows several line circuit-related connectors for a telephone exchange that are affixed to the rack 1'. The connectors, which are coordinated to one or more connection terminals, are structured in rows and positioned in a column 3.

FIGS. 1 and 2 illustrate that two subscriber-related connection terminals are positioned in columns adjacent to said column of line circuit-related connection terminals 3, forming two columns labelled 2 and 2'.

Preferably, said connection terminals 2a, 3a, 2a' will consist of standardised and/or known connection terminals with a predetermined number of connectors inside each terminal.

The columns 2, 3, 2' of connection terminals are situated close to one another. By means of required main distribution conductors (jumpers) the connection terminals are arranged to electrically connect selected subscriber-related connectors with selected line circuit-related connectors.

Ordinarily, the number of jumpers is comparatively large since each connected subscriber must use two physical conductors to connect electrically with its own line circuit.

Inasmuch as this method of connection is known, we will not describe it in greater detail.

To facilitate the reader's understanding, a single main distribution conductor 23 of this kind is shown in FIG. 1. The conductor is connected in a known way to its connector.

A predetermined number—the illustrated embodiment shows eight—of a previously-known kind of telephone exchange-related line circuits is coordinated to a block 10, which supports a printed board that has discrete components mounted on its surface.

When applied to a telephone exchange, the invention requires access to a large number of subscriber-related conductors that are available for connection to a line circuit that has been allocated to a subscriber, via a main distribution arrangement and a conductor 23.

In a practical application, a main distribution arrangement will require several blocks. However, inasmuch as each block may be considered to be identical to the block 10, hereafter we will limit our discussion to that block.

Each block 10 has an external cover 10c of metal, for example aluminium, that envelops a printed board 10' (not pictured) which interacts electrically with its surroundings, which include line circuit-related connection pins and terminals 3a', via block-related connectors 10d.

Although the printed circuit board may have different functions, the ensuing description relates solely to printed circuit boards with line circuits.

Each block 10 may be inserted and removed by means of parallel bars 11, 12 that, in a known way, are affixed to, or make up a part of, said rack 1'. In particular, the bars are affixed to the rack sides 1a, 1b. Also affixed to these sides 1a, 1b are cooling units 13, 14, which are made up of cooling flanges. The front edge of the block 10, as determined when the block is being inserted, shows block-related connectors 10d that are allocated to line circuits, coordinated to a connection terminal 10e. When the block 10 is fully inserted, the connector interacts electrically with said telephone exchange-related connector, coordinated to a connection terminal; for example, the terminal 3a.

Note, the connector 10d associated with the block must directly or indirectly be able to interact electrically with the connectors for the connection terminal 3a, thereby being accessible from the outside for connecting to the subscribers via jumpers.

Said blocks 10 and said bars 11, 12 mechanically interact to such an extent that the heat that is produced by internal components within the block is conducted to the rack sides 1a, 1b, and onward to the side cooling units or cooling flanges 13, 14.

Heat-producing discrete components 10a, 10b such as transformers, diodes, and transistors should be positioned on said printed board 10' adjacent to the area facing the bars 11, 12.

The thickness of the material, as well as the how this thickness is distributed within the cover or the block, is designed to satisfactorily transfer heat via the bars.

Thus, it is possible to vary the thickness of the cover 10c, as well as the length and width of the bars 11, 12.

The thickness of the cover and other parts must be chosen to keep changes in temperature within given parameters, even during short periods of high load; for example, during periods of less than 30 minutes.

Further, the cover 10c is completely sealed in order to provide effective protection against electromagnetic interference (EMI).

The block may even be equipped with one or more surface enlargements.

An example of a surface enlargement might include cooling flanges 10f that protrude from the connection terminals 10d on the edge 10g of the block 10.

Moreover, we see that said line circuit-related connection terminal for block 10 must be able to interact with a corresponding connector in another block 15. In turn, the block 15 shows a connection terminal 15a that interacts electrically with said line circuit-related connection terminal 3a.

The additional block 15 may consist of a simple connection between the connectors in the terminal, or it might contain circuit connections and/or circuit arrangements; for example, over-voltage protection.

Figure 3:
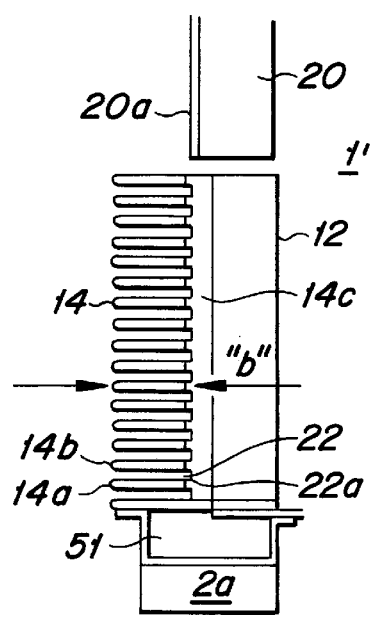
FIG. 3 shows a portion of a horizontal section through the cabinet, in connection to a fan unit, where—for exemplifying purposes—the fan unit is shown outside of the cabinet.

FIG. 3 is meant to illustrate that opposing bars 11, 12 are directly affixed, in a known way, to adjacent cooling flanges.

The length and width of the legs 12a, 12b is allocated to provide a desired heat transfer.

The distance between the legs 12a, 12b is adapted to only slightly exceed the thickness of the block 10.

Further, FIG. 1 shows how a fan unit 20 is used; the fan unit is shown outside of the rack arrangement or cabinet 1.

FIG. 2 shows that a recess or holder 21 for the fan unit is built into the rack arrangement. Said recess or holder occupies a space whose size corresponds to that of two blocks.

From FIG. 3, in particular, it is evident that said fan unit 20 is positioned to the side of the rack unit 1', and oriented adjacent to, or part way inside of, a cooling unit 14 with numerous flanges, where two of these flanges have been designated 14a and 14b.

When fully inserted into the rack unit (not pictured), the fan unit 20 is designed to provide a stream of forced air to each space that is formed between the flanges of the cooling unit 14. One such space 22 is shown between the flanges 14a and 14b. The fan unit 20 is equipped with a track or a column 20a through which a stream of forced air passes. Because the type of fan unit pictured is based on known technology it will not be described in greater detail.

The portion of the stream of forced air that passes through the column 20a continues into the space 22, after which it passes through an opening 22a between the flanges 14a and 14b.

Figure 6:
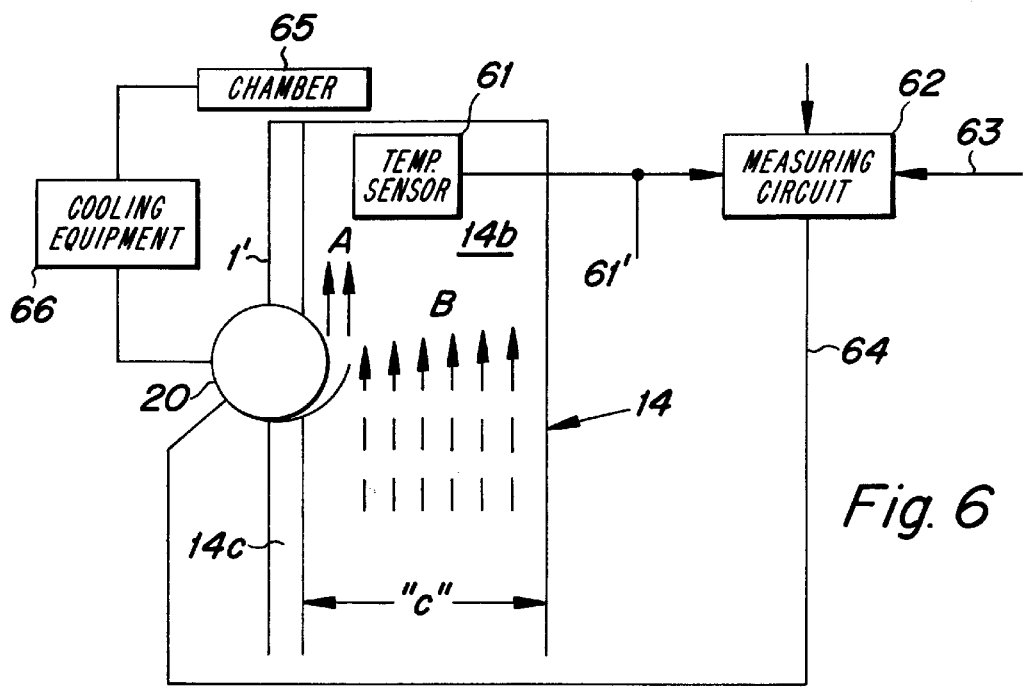
FIG. 6 shows a vertical cross-sectional view of a cooling unit that is affixed to the side of a rack, in order to illustrate how the streams of air are distributed.
Figure 7:
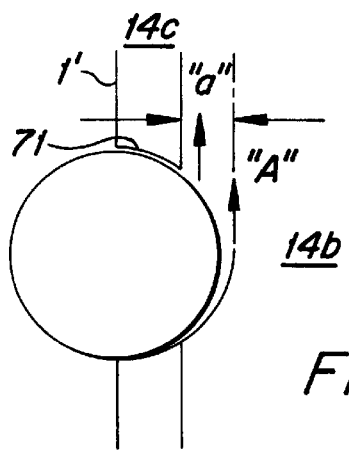
FIG. 7 shows a vertical cross-sectional view of a section adjacent to a fan unit.

Thus, the fan unit 20 is designed to provide a stream of forced air to each space that is formed between the flanges of the cooling unit. However, said stream of forced air is restricted in flow to within the area for the parts of the cooling unit flanges that faces towards the rack unit 1'. The streams of air that are produced for these numerous spaces are aimed to flow in an upwards direction. FIGS. 6 and 7 illustrate this concept in greater detail.

The invention is based on the concept that the distance "b" between adjacent flanges 14a, 14b, and the width of the flanges (see FIG. 5) for one or more chosen spaces is adapted to restrict the flow of said stream of forced air, keeping it primarily within the innermost parts of the space, where it follows parallel, for example "U"-related, parts or surfaces, flowing in an upwards direction.

The cooling unit 14 shows several parallel flanges, oriented away from the rack 1, and extending away from a unit's rack-related base plate 14c, which is designed in part to function as a holder for the fan unit 20.

The holder, which is formed in part in the base plate 14c, and in part in the rack 1', has the shape of a cross-sectional circular recess, and is designed to hold a complementary cylindrical fan unit 20.

Figure 5:
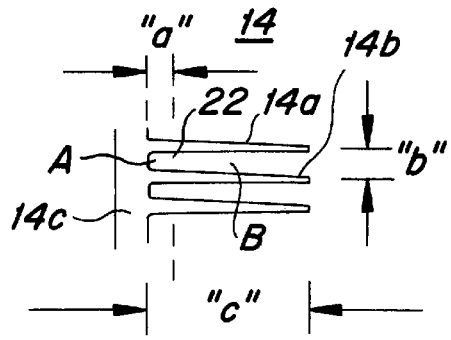
FIG. 5 shows a cross-sectional view of a cooling unit whose embodiment consists of cooling flanges and a base plate whose dimensions are suited to the invention.

The recess in the base plate, which is seen in greater detail in FIGS. 5, 6, and 7, is designed to pass through the base plate and part way into the flanges.

A heat-storage capacity that can be specified for the cooling unit 14 and its materials also falls within the scope of inventive thought; that is, the cooling unit and its materials may be adapted to store heat energy during peak hours without allowing the temperature of the cooling unit to exceed a predetermined value.

The fan unit 20 is designed to be able to produce a continuous stream of forced are that, in terms of heat transmission, is insignificant; however, when the temperature reaches an upper parameter, a means for monitoring temperatures may be activated to allow the fan unit to produce a stream of forced air that, in terms of heat transmission, is very significant.

This is made possible chiefly by allowing the fan unit to run at a very low speed (rpm).

The invention even shows that it is possible to use a single fan unit that may be arranged relative to the rack and the base plate at a selected height level.

The selected height level depends on the expected heat distribution along the cooling unit 14. It is proposed that the fan unit be situated immediately below an area whose temperature is expected to be high.

The invention even shows that it is possible to use several fan units that may be arranged at various height levels. One or more of these fan units can be independently activated by temperature-sensing equipment, depending on the existing, or on an expected, distribution of temperature.

Figure 4:
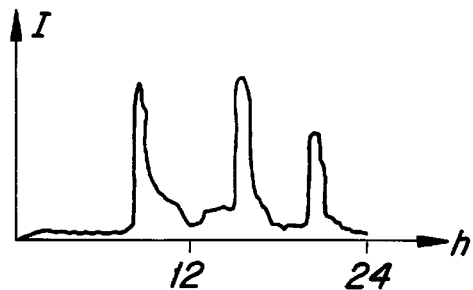
FIG. 4 shows an example of how the intensity of telephone traffic varies throughout a 24-hour period, as well as how the development of energy is distributed in time.

FIG. 4 shows an oversimplified graphical view of how the intensity of telephone traffic is distributed over a 24-hour period. Seen very clearly are certain peak hours, such as the periods between 09:00–09:30, and 15:00–15:30.

FIG. 6 shows a vertical section of a portion of a cooling unit 14, according to FIG. 5, which is affixed to the side of a rack. A stream of forced air "A" is indicated by solid lines; a stream of convected air "B" is indicated by dashed lines.

In a more continuously adapted airflow "A", the velocity of airflow "A" is chosen to correspond to, or at least essentially correspond to, the velocity of the convected airflow "B".

This is the ordinary case. The airflows "A" and "B" are adapted for required cooling with respect to the temperature of the room and cooling effect. In some applications, it may be possible to eliminate airflow "A" completely. The specified airflow arrangement circulates very little dust.

A temperature sensor 61, which senses the temperature in the cooling flange 14b, is connected to a measuring circuit 62 which, via a conductor 63, is provided with a set-point value or a value that represents room temperature.

When the sensor 61 issues a value that is too high, a drive motor is activated in the fan unit 20 via a conductor 64, in order to start a fan, or to increase its speed (rpm), and thereby produce a more powerful stream of forced air "A".

This stream of air "A" is conducted along side surfaces whose contour resembles a "U". The stream of air has a tendency to restrictedly follow the surfaces in an upwards direction with a mild turbulence in the zone between the intermingling airflows "A" and "B".

The stream of forced air "A" is arranged to pass into a chamber 65. Next, it is conducted via cooling equipment 66, and then back to the fan unit 20.

The measuring circuit 62 is adapted in a known way to assign the fan unit 20 a specific speed (rpm), depending on the differences in temperature.

A use of several sensors 61, 61', and so on, falls within the scope of the invention, as well as the use of several fan units, each of which may be regulated according to evaluated temperature values.

FIGS. 5 and 7 show that the recess "a" in the base plate 14c is between 7 and 30 mm deep, preferably 10 mm. The distance "b" between adjacent flanges 14a, 14b is selected to be at 15–20 mm. The width "c" of the flanges 14a, 14b is selected to be at 80 mm.

The stream of air "A" is allowed to pass through a "duct" with a square section, or with an essentially square section, where it collects and then passes into chamber 65.

FIG. 5 shows that the distance "b" between adjacent flanges is selected to be 10–25 mm, for example 16 mm, in order to create a space or a canal 22 within a cooling unit. The width "c" of the flanges is selected to be between 30–120 mm, preferably between 50–100 mm, for example 60–90 mm.

The present invention is especially suited for a main distribution arrangement for a telephone exchange according to the Swedish patent application mentioned earlier in this document. Said main distribution arrangement for a telephone exchange makes up part of, and represents a favourable application of, the present invention.

Obviously, the invention is not limited to the above illustrated exemplifying embodiments, but may be modified within the scope of inventive thought as illustrated in the following claims.

What is claimed is:

1. An arrangement for cooling electronic equipment, comprising:
   a rack arrangement for housing electronic equipment to be cooled, the rack arrangement including heat transfer bodies for transferring the heat energy produced by the electronic equipment to one or more rack-related cooling units, each of the one or more rack-related cooling units being adapted to transfer heat energy by convection to ambient air about the rack arrangement and the electronic equipment;
   at least one of the cooling units includes vertically-oriented cooling flanges, positioned next to one another, successive ones of the cooling flanges defining spaces therebetween, and a fan unit adapted to provide the cooling unit and the cooling flanges with a stream of forced air such that heat emission from the cooling flanges to the ambient air is increased, the fan unit being positioned proximate the cooling flanges and located at a side of the rack unit;
   the fan unit being arranged to provide a stream of forced air to each of the spaces formed between the cooling flanges of the cooling unit, a flow of the stream of forced air being restricted to within an area defined by portions of the cooling flanges that face toward the rack unit, and the flow of the stream of forced air being in an upward direction for at least several spaces, wherein at least one of the cooling units includes several parallel flanges, oriented away from the rack, extending away from a rack-related base plate.

2. An arrangement according to claim 1, wherein a distance between adjacent flanges and a width of the flanges for one or more given spaces restrict the flow of forced air to within inner sections of the spaces, and to keep it flowing upwards.

3. An arrangement according to claim 2, wherein a zone between the forced air and convected air has increased turbulence relative to a zone remote from the convected air.

4. An arrangement according to claim 1, wherein the base plate includes a holder formed in part in the base plate and in part in the rack, the holder having the shape of a recess in the base plate for holding the fan unit.

5. An arrangement according to claim 4, wherein the recess in the base plate extends through the base plate and into the cooling flanges.

6. An arrangement according to claim 5, operating mode wherein the fan unit produces a first stream of forced air, and the arrangement includes a temperature monitoring means that sends a signal to the fan unit when a predetermined temperature is reached and cause the fan unit to operate in a second operating mode wherein the fan unit produces a second stream of forced air that is greater than the first stream of forced air.

7. An arrangement according to claim 6, wherein the arrangement includes a plurality of fan units and temperature-monitoring equipment for activating one or more of the plurality of fan units as a function of monitored temperature.

8. An arrangement according to claim 4, wherein the fan unit is attached to the rack and the base plate.

9. An arrangement according to claim 1, wherein the cooling unit is sized to provide sufficient heat transfer to prevent a temperature of the cooling unit from exceeding a predetermined value during a hottest normal operating mode of the electronic equipment.

10. An arrangement according to claim 1, wherein the fan unit has a first operating mode wherein the fan unit produces a first stream of forced air, and the arrangement includes a temperature monitoring means that sends a signal to the fan unit when a predetermined temperature is reached and cause the fan unit to operate in a second operating mode wherein the fan unit produces a second stream of forced air that is greater than the first stream of forced air.

11. An arrangement according to claim 10, wherein the arrangement includes a plurality of fan units and temperature-monitoring equipment for activating one or more of the plurality of fan units as a function of monitored temperature.

12. An arrangement according to claim 1, wherein a distance between adjacent flanges is between 10 and 25 mm, and a width of the flanges is between 30 and 120 mm.

13. An arrangement for cooling electronic equipment, comprising:

a rack arrangement for housing electronic equipment to be cooled, the rack arrangement including with heat transfer bodies for transferring the heat energy produced by the electronic equipment to one or more rack-related cooling units, each of the one or more rack-related cooling units being adapted to transfer heat energy by convection to ambient air about the rack arrangement and the electronic equipment;

at least one of the cooling units includes vertically-oriented cooling flanges, positioned next to one another, successive ones of the cooling flanges defining spaces therebetween, and a fan unit adapted to provide the cooling unit and the cooling flanges with a stream of forced air such that heat emission from the cooling flanges to the ambient air is increased, the fan unit being positioned proximate the cooling flanges and located at a side of the rack unit;

the fan unit being arranged to provide a stream of forced air to each of the spaces formed between the cooling flanges of the cooling unit, a flow of the stream of forced air being restricted to within an area defined by portions of the cooling flanges that face toward the rack unit, and the flow of the stream of forced air being in an upward direction for at least several spaces, wherein the arrangement includes a plurality of fan units and temperature-monitoring equipment for activating one or more of the plurality of fan units as a function of monitored temperature.

14. An arrangement for cooling electronic equipment, comprising:

a rack arrangement for housing electronic equipment to be cooled, the rack arrangement including with heat transfer bodies for transferring the heat energy produced by the electronic equipment to one or more rack-related cooling units, each of the one or more rack-related cooling units being adapted to transfer heat energy by convection to ambient air about the rack arrangement and the electronic equipment;

at least one of the cooling units includes vertically-oriented cooling flanges, positioned next to one another, successive ones of the cooling flanges defining spaces therebetween, and a fan unit adapted to provide the cooling unit and the cooling flanges with a stream of forced air such that heat emission from the cooling flanges to the ambient air is increased, the fan unit being positioned proximate the cooling flanges and located at a side of the rack unit;

the fan unit being arranged to provide a stream of forced air to each of the spaces formed between the cooling flanges of the cooling unit, a flow of the stream of forced air being restricted to within an area defined by portions of the cooling flanges that face toward the rack unit, and the flow of the stream of forced air being in an upward direction for at least several spaces, wherein the electronic equipment and the rack arrangement include a main distribution arrangement for a telephone exchange, including a rack, a plurality of switchboard-related connectors whose positions are affixed to the rack, coordinated to one or more connection terminals, and a plurality of connectors that belong to telephone exchange-related line circuits, also affixed to the rack and coordinated to one or more connection terminals; the connection terminals being situated proximate one another, and being arranged, along with main distribution conductors, to connect switchboard-related connectors with telephone exchange-related connectors.

15. An arrangement according to claim 11, wherein a predetermined number of telephone exchange-related line circuits are coordinated to a block of a plurality of blocks, and each of the blocks is insertable into and removable from a corresponding rack arrangement using ones of the heat transfer bodies forming a parallel bar arrangement.

16. An arrangement according to claim 12, wherein bars of the parallel bar arrangement are in direct contact with cooling flanges.

17. An arrangement according to claim 12, wherein heat-emitting discrete components are positioned in the block proximate the bars.

18. An arrangement according to claim 17, wherein the block is equipped with one or more surface enlargements.

19. An arrangement according to claim 12, wherein each block of the plurality of blocks includes a metallic cover enclosing a printed board with discrete components.

20. An arrangement according to claim 15, wherein the cover transfers heat via the bars of the parallel bar arrangement to the cooling unit.

21. An arrangement according to claim 15, wherein the cover is sealed such that it provides protection against electromagnetic interference (EMI).

22. An arrangement according to claim 15, wherein cooling flanges are integral with the bars.

* * * * *